(12) United States Patent
Yoon et al.

(10) Patent No.: US 8,426,086 B2
(45) Date of Patent: Apr. 23, 2013

(54) MASK AND METHOD OF MANUFACTURING ARRAY SUBSTRATE USING THE SAME

(75) Inventors: Soo-Wan Yoon, Hwaseong-si (KR); Yeong-Keun Kwon, Yongin-si (KR); Chong-Chul Chai, Seoul (KR)

(73) Assignee: Samsung Display Co., Ltd., Yongin (KR)

( * ) Notice: Subject to any disclaimer, the term of this patent is extended or adjusted under 35 U.S.C. 154(b) by 29 days.

(21) Appl. No.: 13/166,587

(22) Filed: Jun. 22, 2011

(65) Prior Publication Data
US 2012/0190157 A1    Jul. 26, 2012

(30) Foreign Application Priority Data

Jan. 24, 2011    (KR) .................. 10-2011-0006652

(51) Int. Cl.
*G03F 1/38*    (2006.01)
*G03F 7/20*    (2006.01)

(52) U.S. Cl.
USPC .............................................. 430/5; 430/321

(58) Field of Classification Search .............. 430/5, 321, 430/394; 359/619
See application file for complete search history.

(56) References Cited

U.S. PATENT DOCUMENTS
2006/0061708 A1*    3/2006    Umebayashi et al. .......... 349/95

FOREIGN PATENT DOCUMENTS
JP    2004-349433    12/2004
KR    10-0531416    11/2005
KR    10-0796590    1/2008

\* cited by examiner

*Primary Examiner* — Stephen Rosasco
(74) *Attorney, Agent, or Firm* — H.C. Park & Associates, PLC

(57) ABSTRACT

A mask includes: a substrate that includes a central area and a peripheral area disposed around the central area; and lenses disposed in rows and columns, in the central area and the peripheral area. The lenses of opposing sides of the peripheral area may be disposed in different rows or columns. For a given amount of input light, the lenses of the peripheral area may focus less light on a substrate than the lenses of the central area. The mask may be disposed over the substrate in different positions, and then the substrate may be irradiated through the mask, while the mask is in each of the positions. The peripheral portion of the mask may be disposed over the same area of the substrate, while the mask is in different ones of the positions.

12 Claims, 20 Drawing Sheets

MASK AND METHOD OF MANUFACTURING ARRAY SUBSTRATE USING THE SAME

CROSS REFERENCE TO RELATED APPLICATION

This application claims priority from and the benefit of Korean Patent Application No. 2011-0006652, filed on Jan. 24, 2011, which is hereby incorporated by reference for all purposes as if fully set forth herein.

BACKGROUND OF THE INVENTION

1. Field of the Invention

Exemplary embodiments of the present invention relate to a mask and a method of manufacturing an array substrate using the mask.

2. Description of the Related Art

Generally, a liquid crystal display ("LCD") panel may include an array substrate, an opposite substrate facing the array substrate, and a liquid crystal layer interposed between the array substrate and the opposite substrate. A plurality of switching elements for driving pixel areas may be formed on the array substrate. The LCD panel may display an image by applying an electric field to the liquid crystal layer.

The array substrate and the opposite substrate include a plurality of pixels arranged in a matrix. Each of the pixels includes at least one thin-film transistor ("TFT") for driving the pixel. The TFT includes a gate electrode, a semiconductor layer, a source electrode, and a drain electrode. One pixel includes at least one TFT. The TFT is located in a non-display area where an image is not formed. Thus, an aperture ratio is decreased by the non-display area. Moreover, when multiple TFTs are formed within one pixel, an aperture ratio is further decreased.

In a manufacturing process of an array substrate, a semiconductor layer of the TFT is formed by crystallizing an amorphous silicon layer. During the crystallization, the amorphous silicon layer coated on the entire array substrate is crystallized, and then unnecessary portions are removed. When the amorphous silicon layer is crystallized, a laser is generally radiated onto the entire array substrate, which can be a time consuming process. Thus, an improved manufacturing method of an array substrate is needed, which is capable of processing the crystallization rapidly and effectively.

SUMMARY OF THE INVENTION

Exemplary embodiments of the present invention provide a mask used to crystallize a silicon layer, so as to improve the display quality of a panel.

Exemplary embodiments of the present invention also provide a method of manufacturing an array substrate using the above-mentioned mask.

Additional features of the invention will be set forth in the description which follows, and in part will be apparent from the description, or may be learned by practice of the invention.

Exemplary embodiments of the present invention also provide a mask that includes a substrate that includes a central area and a peripheral area, lenses disposed in the central and peripheral areas, and a light-blocking layer disposed between the lenses.

According to another aspect of the present invention, provided is a mask that includes a substrate that includes a central area and a peripheral area; first lenses disposed in the central area and second lenses disposed in the peripheral area. For a given amount of input light, the first lenses may focus more light than the second lenses. The second lenses may be half-tone lenses.

According to still another aspect of the present invention, there is provided a method of manufacturing an array substrate. In the method, gate wiring and gate electrodes connected to the gate wiring are formed on a base substrate. Amorphous silicon layers are coated on the gate electrodes. A mask is disposed a mask in different positions over the substrate, the mask comprising a central area, a peripheral area disposed around the central area, and lenses disposed in the central area and the peripheral area. The amorphous silicon layers are irradiated through the mask, while the mask is in each of the positions, to sequentially crystallize the amorphous silicon layers. Source electrodes and drain electrodes are formed on the crystallized silicon layer.

According to some exemplary embodiments of the present invention, laser light is condensed through lenses formed on a mask to crystallize amorphous silicon, thereby increasing an electron mobility of TFTs formed on a pixel area, so that the TFTs may be formed in a small size. Thus, a space occupied by the TFTs within pixels may be decreased, so that an aperture ratio of the pixels may be greatly enhanced.

Moreover, the appearance of brightness variations between different groups of pixels can be reduced, by crystallizing the silicon layers at the borders of adjacent groups in different operations. Thus, luminance differences due to differences in laser intensity may be obscured, thereby reducing the incidence of defective displays.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE EXEMPLARY EMBODIMENTS

Figure 1:
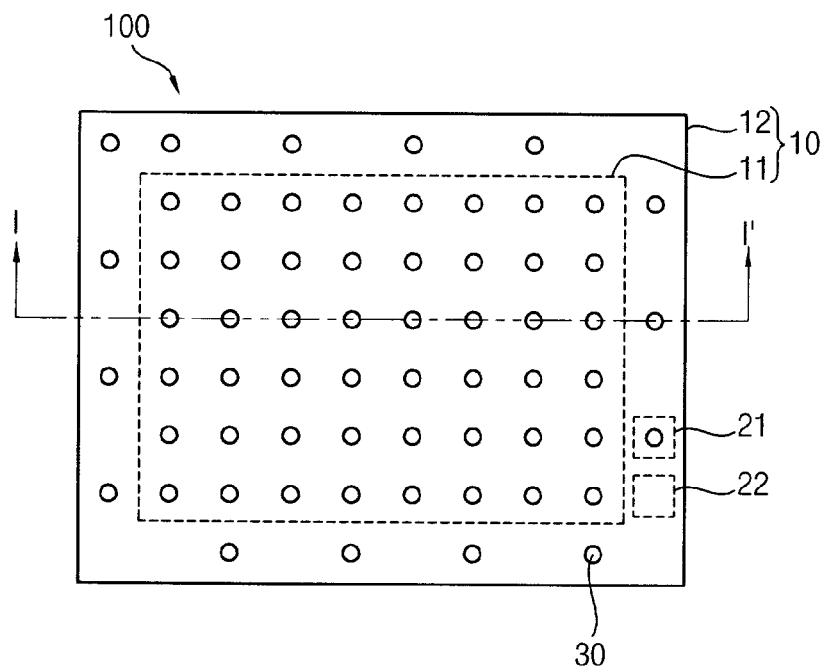
FIG. 1 is a pan view showing a mask according to an exemplary embodiment of the present invention.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

Figure 2:
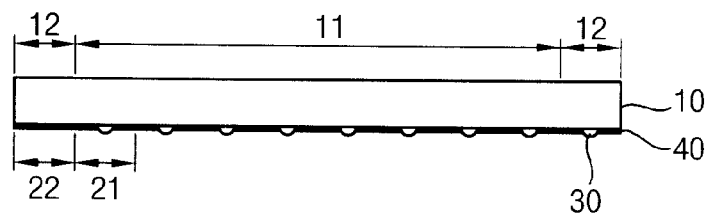
FIG. 2 is a cross-sectional view taken along a line I-I' of FIG. 1.

FIG. 1 is a pan view showing a mask 100, according to an exemplary embodiment of the present invention. FIG. 2 is a cross-sectional view taken along a line I-I' of FIG. 1. Referring to FIGS. 1 and 2, the mask 100 includes a substrate 10 that includes a central area 11 and a peripheral area 12 disposed around the central area 11. The substrate 10 may be rectangular or square-shaped. First areas 21 including a transmitting portion, second areas 22 including a non-transmitting portion, and a plurality of lenses 30 are formed on the substrate 10.

In this exemplary embodiment, the light-blocking layer 40 is used to prevent light from exiting portions of the substrate 10. Alternatively, the substrate 10 may be formed from an opaque material. When the substrate 10 is opaque, the lenses 30 may be disposed in slits or holes formed in the substrate 10 and the light-blocking layer 40 may be omitted.

Each of the lenses 30 focuses laser light incident thereto, onto an area to be crystallized. The light-blocking layer 40 prevents unfocused light from exiting the substrate 10.

Referring again to FIG. 2, the substrate 10 includes the central area 11, the peripheral area 12, the lenses 30, and the light-blocking layer 40. The substrate 10 may include a transparent material, such as glass, plastic, or the like.

The light-blocking layer 40 is formed on the substrate 10 to block the laser light. The light-blocking layer 40 covers a surface of the substrate 10, except for where the lenses 30 formed. The light-blocking layer 40 may include a metallic material. The substrate 10 and the lenses 30 may be integrally formed.

The lenses 30 are formed on the substrate 10, and then the light-blocking layer 40 is formed between the lenses 30 to complete the mask 100. Alternatively, the light-blocking layer 40 may be formed on an opposing surface of the substrate 10.

Thus, the mask 100 focuses laser light onto amorphous silicon layers of an array substrate, to crystallize the silicon layers. The mask 100 is formed to have a smaller size than an array substrate. Thus, the mask is moved with respect to the array substrate, to crystallize different areas thereof.

Figure 3:
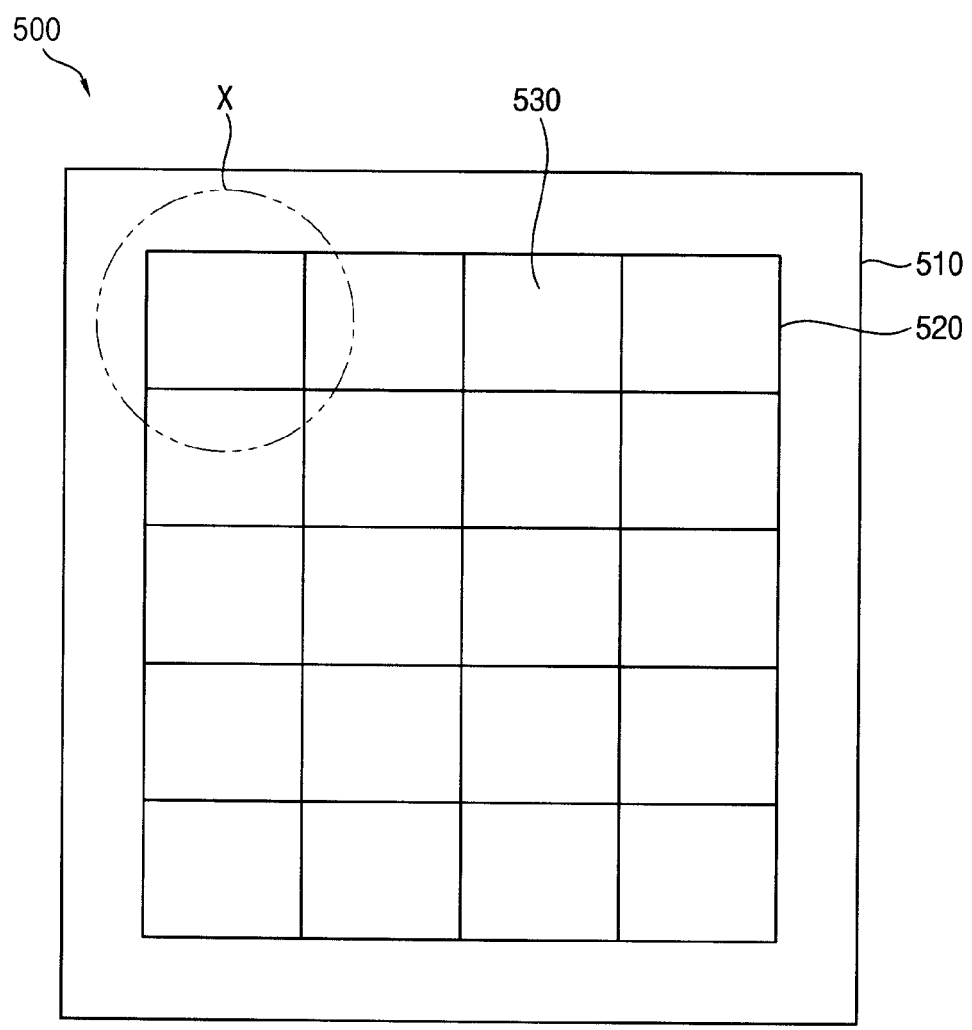
FIG. 3 is a plan view showing an array substrate manufactured by using the mask of FIG. 1.

FIG. 3 is a plan view showing an array substrate manufactured using the mask of FIG. 1. Referring to FIG. 3, the array substrate 500 includes a pixel area 520 and a peripheral area 510.

The pixel area 520 includes pixels arranged in a matrix. The pixels are crystallized by using the mask 100 (shown in FIGS. 1 and 2), according to an exemplary embodiment of the present invention. Since the mask 100 is smaller than the pixel area 520, the pixel area 520 is divided into crystallization areas 530 that are sequentially crystallized by moving the mask 100.

Figure 4:
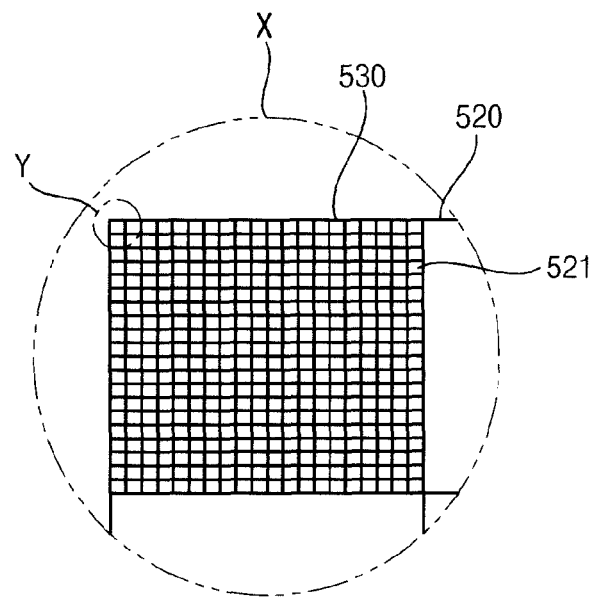
FIG. 4 is a partial enlarged plan view of portion 'X' of FIG. 3.

FIG. 4 is a partial enlarged plan view of portion 'X' of FIG. 3. Referring to FIGS. 3 and 4, each of the crystallization areas 530 includes a plurality of pixels 521.

The crystallization area 530 is a virtual area corresponding to the mask 100. Each of the pixels 521 includes a TFT and a pixel electrode. The pixels 521 transmit light in accordance with an input signal. The pixel electrode may be transparent, and the TFT may be opaque. Thus, the TFT may interfere with light transmission. When the TFT occupies a smaller portion of one pixel 521, an aspect ratio of the pixel 521 is increased, which improves image quality.

Figure 5:
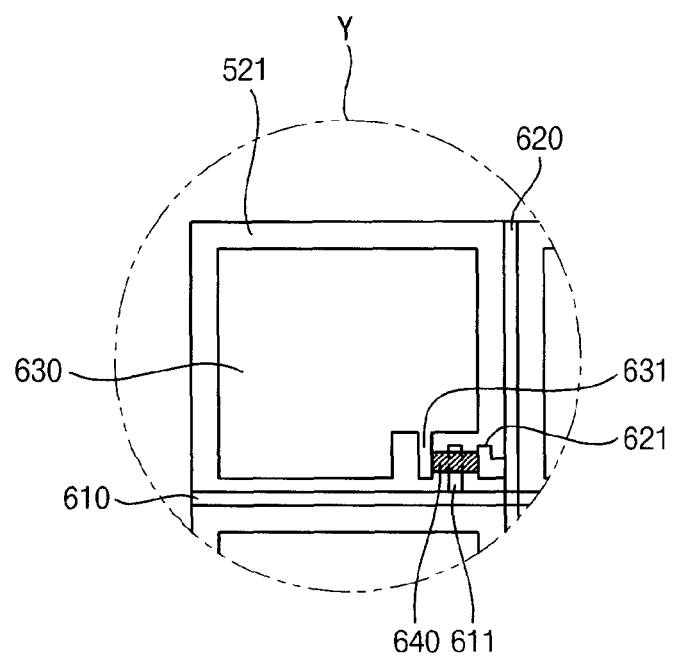
FIG. 5 is a partial enlarged plan view of portion 'Y' of FIG. 4.
Figure 6A:
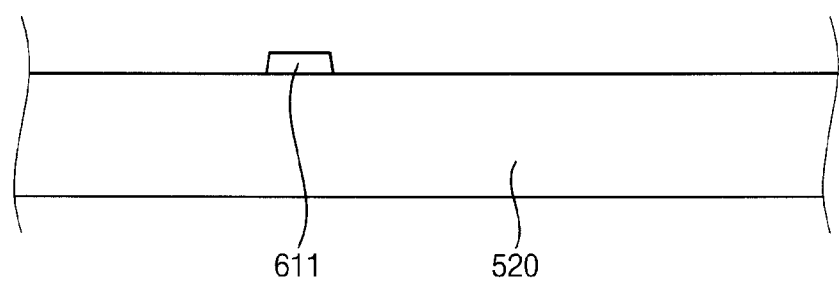
FIGS. 6A, 6B, 6C, and 6D are cross-sectional views showing a method of manufacturing an array substrate using the mask of FIG. 1.
Figure 6B:
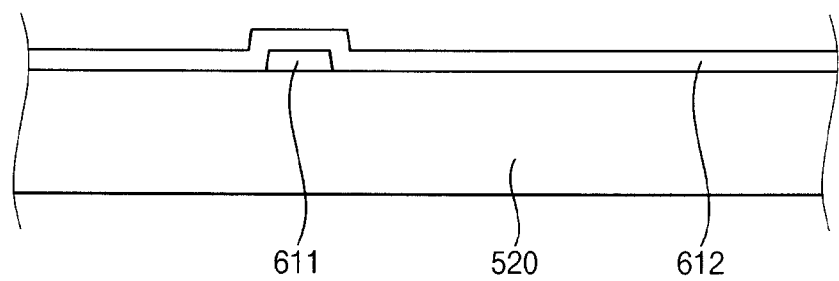
Figure 6C:
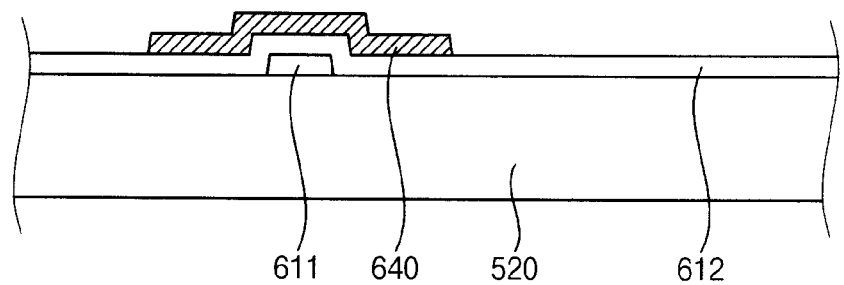
Figure 6D:
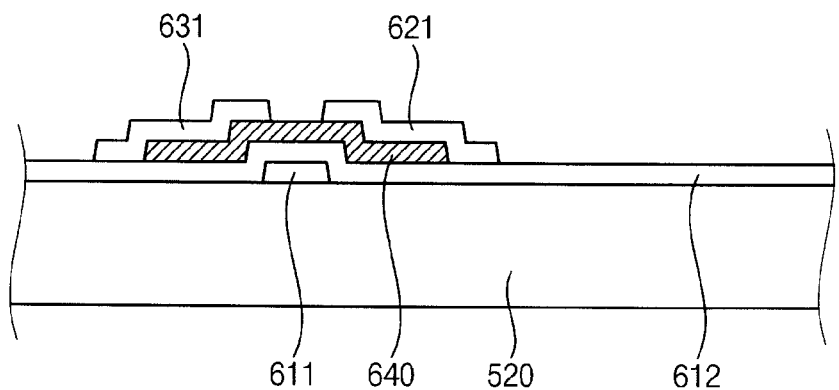

FIG. 5 is a partial enlarged plan view of portion 'Y' of FIG. 4. Referring to FIG. 5, the pixel 521 includes a gate wiring 621, a gate electrode 611, a data wiring 620 electrically connected to the gate wiring 621, a source electrode 621, a pixel electrode 630 electrically connected to the data wiring 620, a drain electrode 631 spaced apart from the source electrode 621 and electrically connected to the pixel electrode 630, and an active layer 640.

The active layer 640 is formed between the gate electrode 611 and the source/drain electrodes 621 and 631, to configure a thin-film transistor (TFT). The TFT may control the pixel electrode 630 in accordance with an input signal. The input signal may be delivered by the gate wiring 621 and the data wiring 620.

Each of lenses 30 of the mask 100 is disposed facing one of the active layers 640 during crystallization. Then a laser is radiated through the mask 100 to crystallize the active layers 640. Referring again to FIG. 1, laser light is condensed by the lenses 30. Thus, the active layers 640 may be crystallized by high density ions.

When the active layer 640 is crystallized by high density ions, the electron mobility of the active layer 640 is greatly increased. A conventional TFT active layer has an electron mobility of about 0.5 $cm^2/\mu s$. However, the active layer 640 crystallized by the mask 100 may have an electron mobility of up to about 5 $cm^2/\mu s$. In this case, the active layer 640 may be smaller, while still having the same capability as a larger conventional TFT. As a result, the aperture ratio of the pixel 521 may be greatly increased.

FIGS. 6A, 6B, 6C, and 6D are cross-sectional views showing a method of manufacturing the TFT of the pixel 521 shown in FIG. 5. Referring to FIGS. 6A to 6D, the gate electrode 611 is formed on the base substrate 520. An insulation layer 612 is formed on the gate electrode 611. An amorphous silicon layer 641 is formed on the insulation layer 612 facing the gate electrode 611.

The mask 100 is disposed facing the substrate 520 and laser light is radiated through one of the lenses 30 and onto the amorphous silicon layer 641. The laser light crystallizes the amorphous silicon layer 641 into the active layer 640 having a high electron mobility, so that a small TFT may be formed. Then the source and drain electrodes 621 and 631 are formed on the active layer 640.

The method of FIGS. 6A to 6D is an example of a process for forming a TFT using the mask 100. However, according to various embodiments, the method and/or mask 100 may be modified in various ways.

Figure 7:
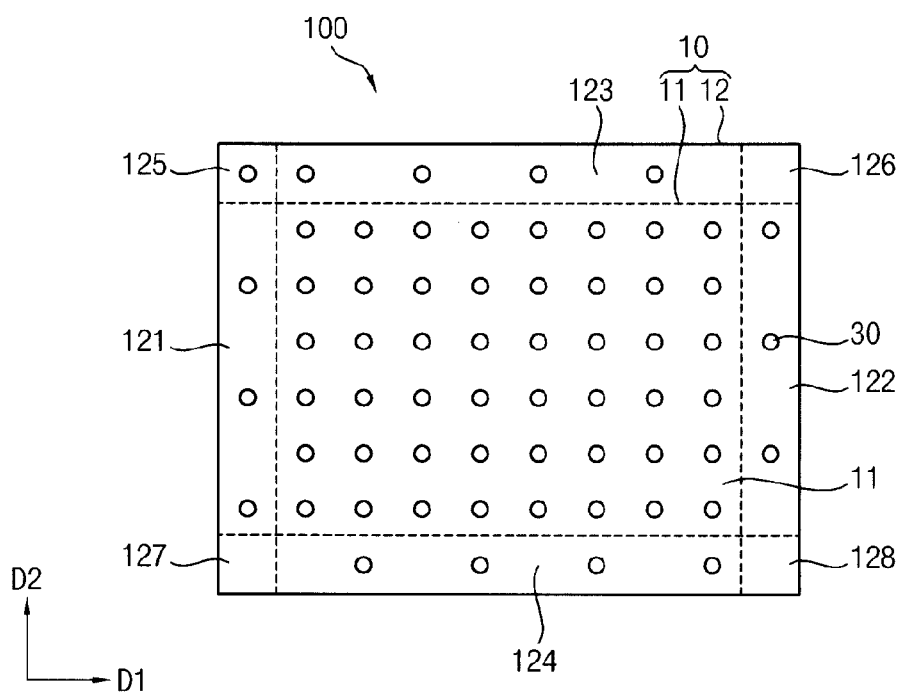
FIG. 7 is a plan view showing an area of the mask of FIG. 1.

FIG. 7 is a plan view further describing the mask 100 of FIG. 1. Referring to FIG. 7, the mask 100 includes the central area 11 and the peripheral area 12. The peripheral area 12 includes a first side 121, a second side 122, a third side 123, and a fourth side 124. Moreover, the peripheral area 12 may include a first corner 125, a second corner 126, a third corner 127, and a fourth corner 128.

The first side 121 and the second side 122 are disposed on opposing sides of the central area 11 and extend lengthwise, in a first direction D1. The third side 123 and the fourth side 124 are disposed on opposing sides of the central area 11 and extend lengthwise, in a second direction D2. The second direction D2 may be substantially perpendicular to the first direction D1.

The first corner 125 is positioned between the first side 121 and the third side 123, and the second corner 126 is positioned between the third side 123 and the second side 122. The third corner 127 is positioned between the first side 121 and the fourth side 124, and the fourth corner 128 is positioned between the second side 122 and the fourth side 124. The first corner 125 includes a lens 30. However, the present invention is not limited thereto, as the lens 30 may be disposed in any of the corners 125, 126, 127, and 128.

The lenses 30 are formed in a matrix of rows and columns. However, the rows and columns are offset with respect to the peripheral area 12. In other words, each row includes a lens 30 in only one of the first and second sides 121 and 122, and each column includes a lens 30 in only one of the third and fourth sides 123 and 124. Thus, the lenses 30 disposed in the first side 121 are disposed in different rows than the lenses 30 disposed in the second side 122. In addition, the lenses 30 disposed in the third side 123 are disposed in different columns than the lenses 30 disposed in the fourth side 124. As such, the sides 121-124 may be disposed over the same areas during crystallization, as discussed below.

Figure 8:
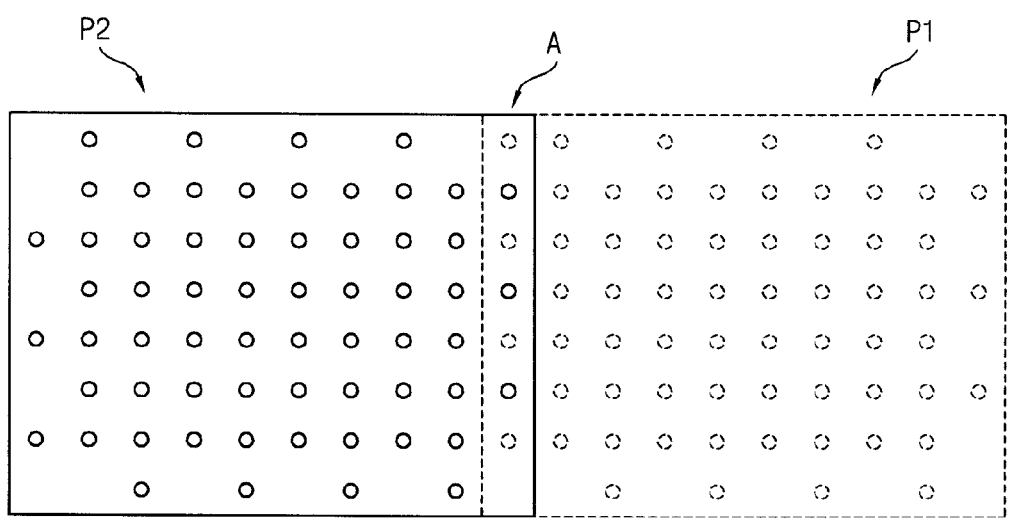
FIGS. 8, 9 and 10 are plan views showing an appearance in which the mask of FIG. 1 is used.

FIG. 8 is a plan view showing a lateral movement of the mask 100 during a crystallization process. Referring to FIG. 8, the mask 100 is initially disposed in position P1, and a laser is radiated through the lenses 30 to crystallize a first group of active layers. The mask 100 is then moved laterally to position P2, and the laser is radiated through the lenses 30 to crystallize a second group of active layers.

The positions P1 and P2 overlap, such that the first and second edges 121 and 122 are sequentially disposed in area A, i.e., over the same column of active layers. However, since the lenses 30 of the first and second sides 121 and 122 are disposed in different rows, each silicon layer in area A is irradiated only once.

Figure 9:
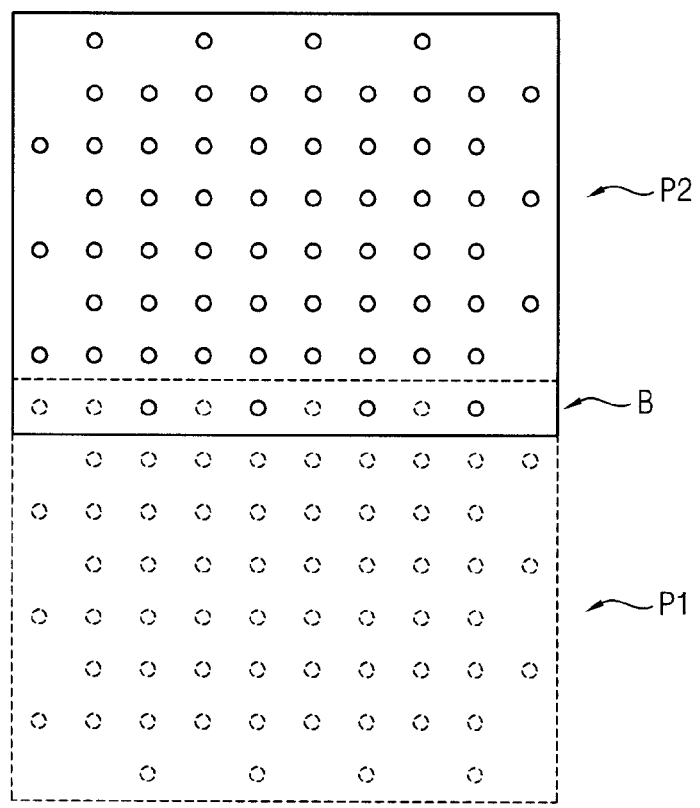

FIG. 9 is a plan view showing a vertical movement of the mask 100 during a crystallization process. Referring to FIG. 9, the process is similar to the process of FIG. 8, except that the mask is moved vertically from position P1 to position P2. As such, the third and fourth sides 123 and 124 of the mask 100 are sequentially disposed in area B, i.e., over the same row of active layers. Thus, the lenses 130 of the third and fourth sides 123 and 124 are used to crystallize the active layers disposed in area B. However, since the lenses 30 of the second and third sides 123 and 124 are disposed in different columns, each silicon layer of area B is only irradiated once.

Figure 10:
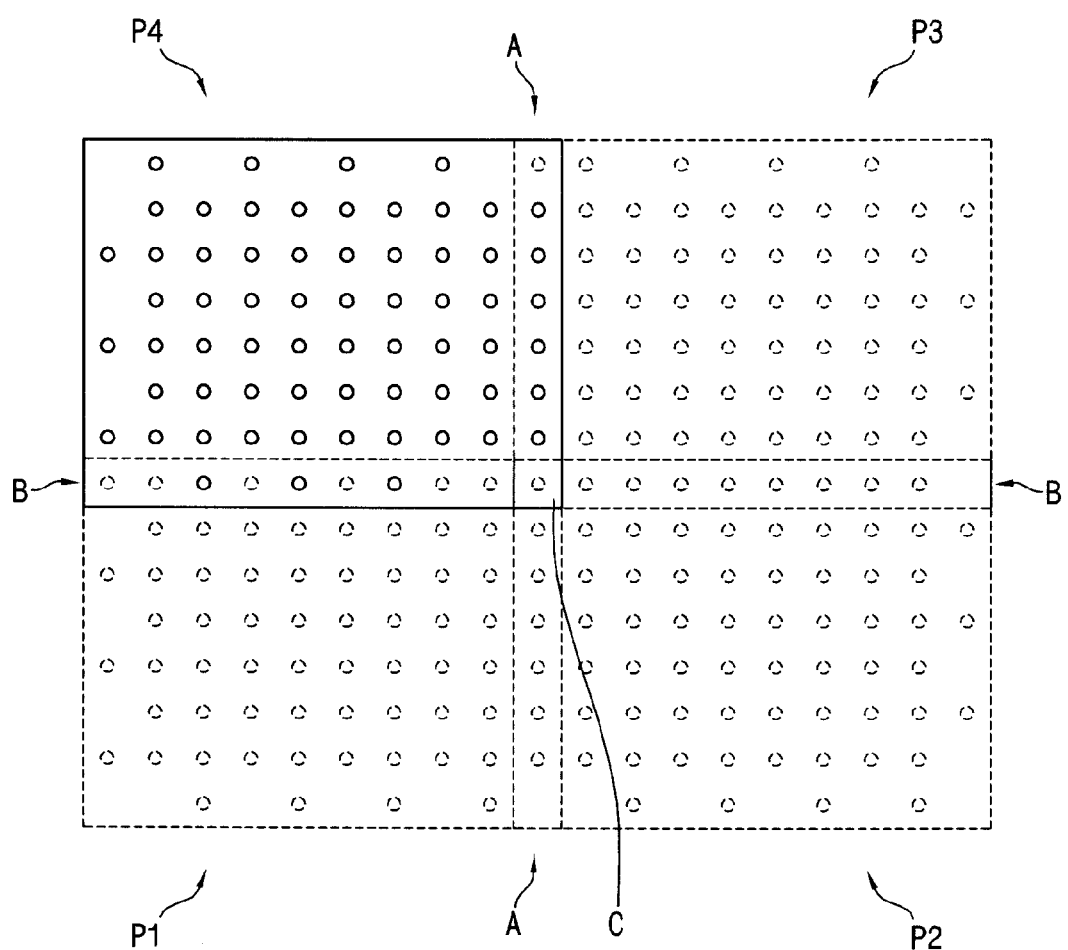

FIG. 10 is a plan view showing a crystallization process that includes a combination of the processes shown in FIGS. 8 and 9. Referring to FIG. 10, the mask 100 is moved between positions P1-P4 and underlying silicon layers are crystallized. The mask 100 may be moved between the positions P1-P4 in any order. Accordingly, the first and second edges 121 and 122 are sequentially disposed in area A, and the third and fourth edges 123 and 124 are sequentially disposed in area B. As such, the corners 125, 126, 127, and 128 are sequentially disposed in area C, where areas A and B overlap. However, since only corner 125 includes a lens 30, a silicon layer disposed in area C is only irradiated once.

Figure 11A:
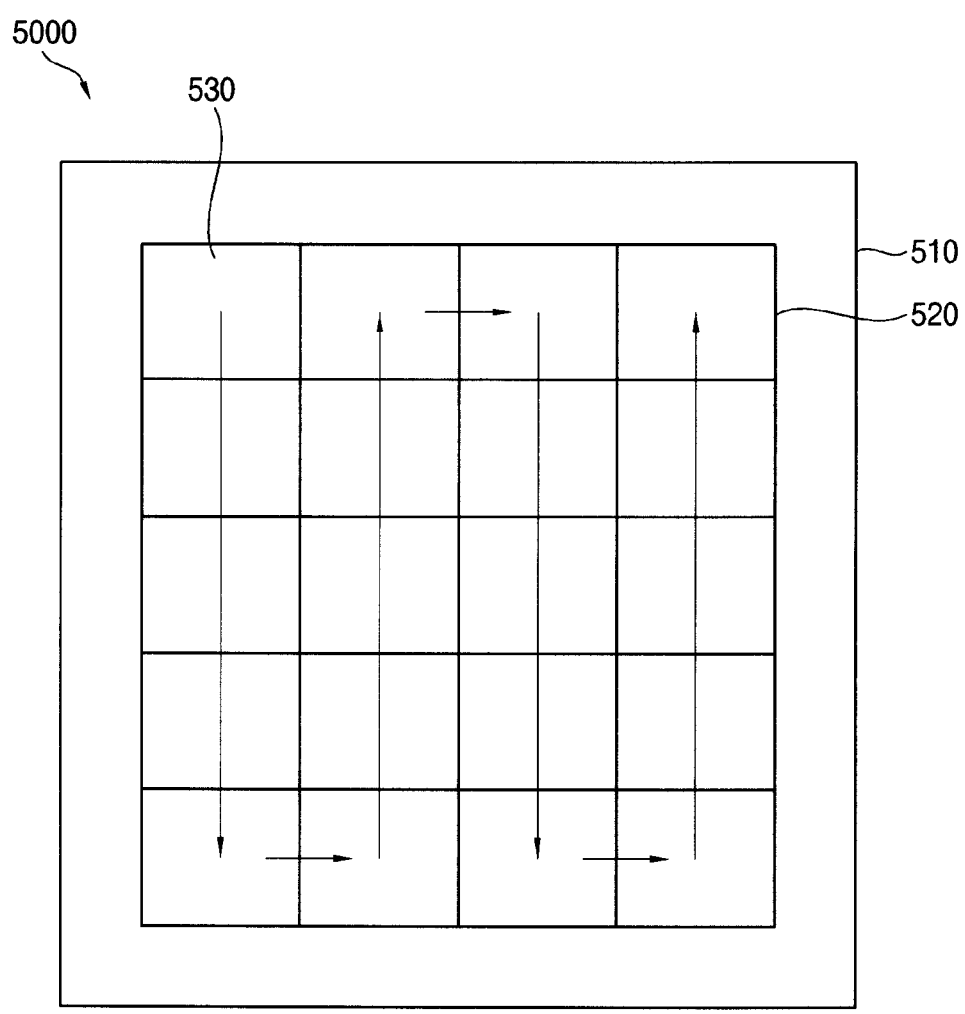
FIGS. 11A, 11B, and 11C are plan views showing the movement of the mask of FIG. 1 across an array substrate.
Figure 11B:
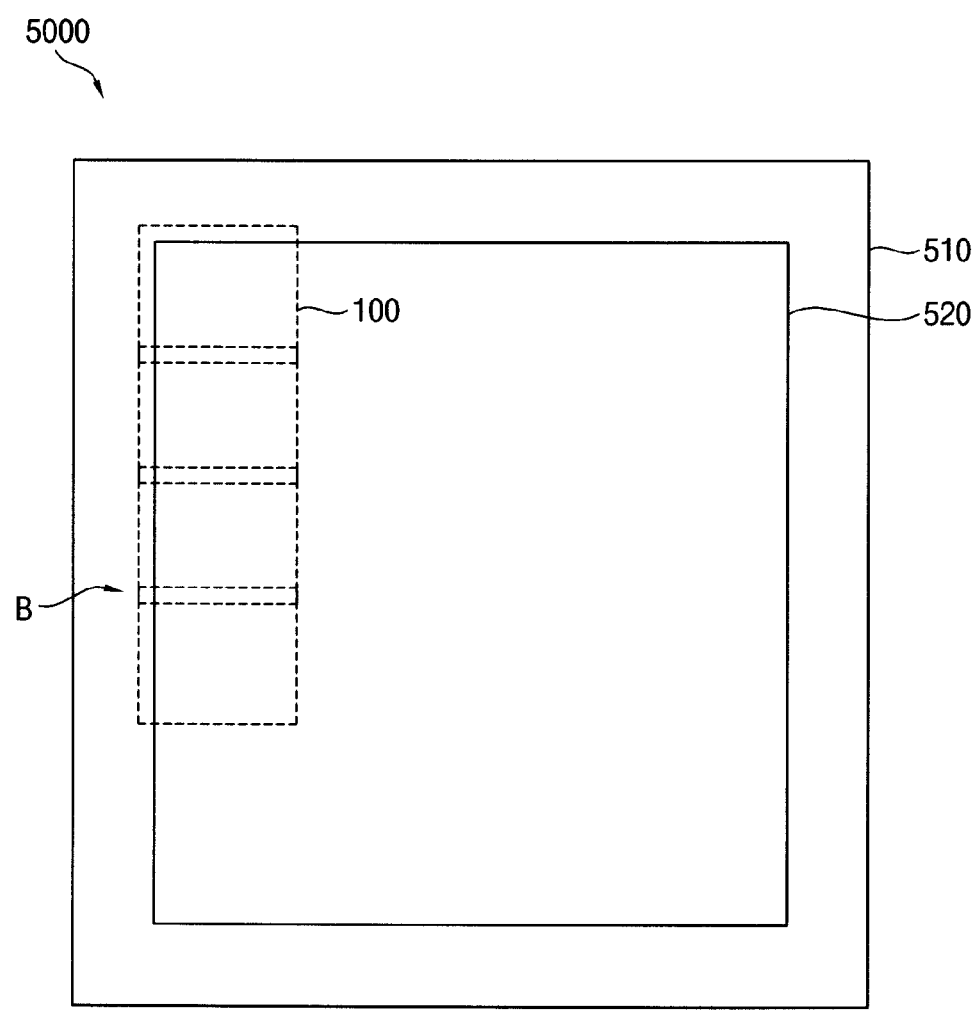
Figure 11C:
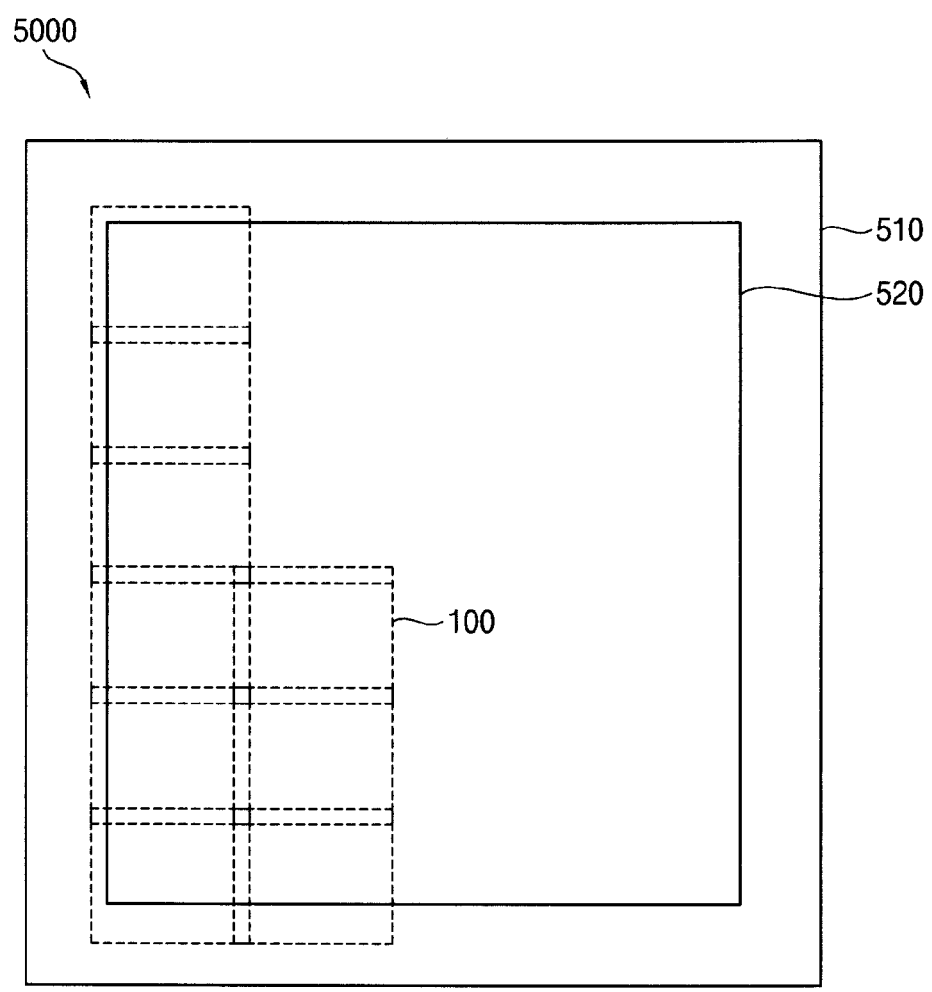

FIGS. 11A, 11B, and 11C are plan views showing the movement of the mask 100 over an array substrate 500. Referring to FIG. 11A, a pixel area 520 of the array substrate 5000 is divided into crystallization areas 530. The mask 100 is moved to each of the crystallization areas 530 and a laser is irradiated onto the mask 100. In other words, the mask 100 is moved along the array substrate in a raster pattern.

When a laser is irradiated onto crystallization areas 530 in different portions of the array substrate 5000, the strength/intensity of the laser may vary. The intensity variation may generate a difference in the crystallization amounts the silicon layers in the crystallization areas 530.

As a result, crystallization areas 530 may vary in brightness. For example, the different brightness may be emphasized at boundary portions of the crystallization areas 530. In this case, display defects, such as a horizontal line defect and a vertical line defect, may be displayed on the pixel area 520. Such defects may result in a panel being defective.

However, according to aspects of the present invention, the silicon layers at edges of the crystallization areas 530 are crystallized in different irradiation operations. Thus, brightness differences between active regions produced in each operation are less noticeable. Therefore, the appearance of line defects is reduced.

FIGS. 11B and 11C are plan views showing the movement of the mask 100 is moved between different crystallization areas 530 in the pixel area 520 of the array substrate 5000. Each of the crystallization areas 530 is sequentially irradiated through the mask 100, to form active layers. Referring to FIG. 11B, the mask 100 is moved along the path of FIG. 11A. The third and fourth sides 123 and 124 (shown in FIG. 9) are sequentially disposed in area B. The first and third sides 121 and 124 are initially disposed facing the peripheral area 510.

Referring to FIG. 11C, the mask 100 is moved along the path shown in FIG. 11A. The corners 125-128 are sequentially disposed in area C. Since only one of the corners 125-128 includes a lens 30, the silicon layer in area C is irradiated only once. The process continues until all of the silicon layers are crystallized.

Figure 12A:
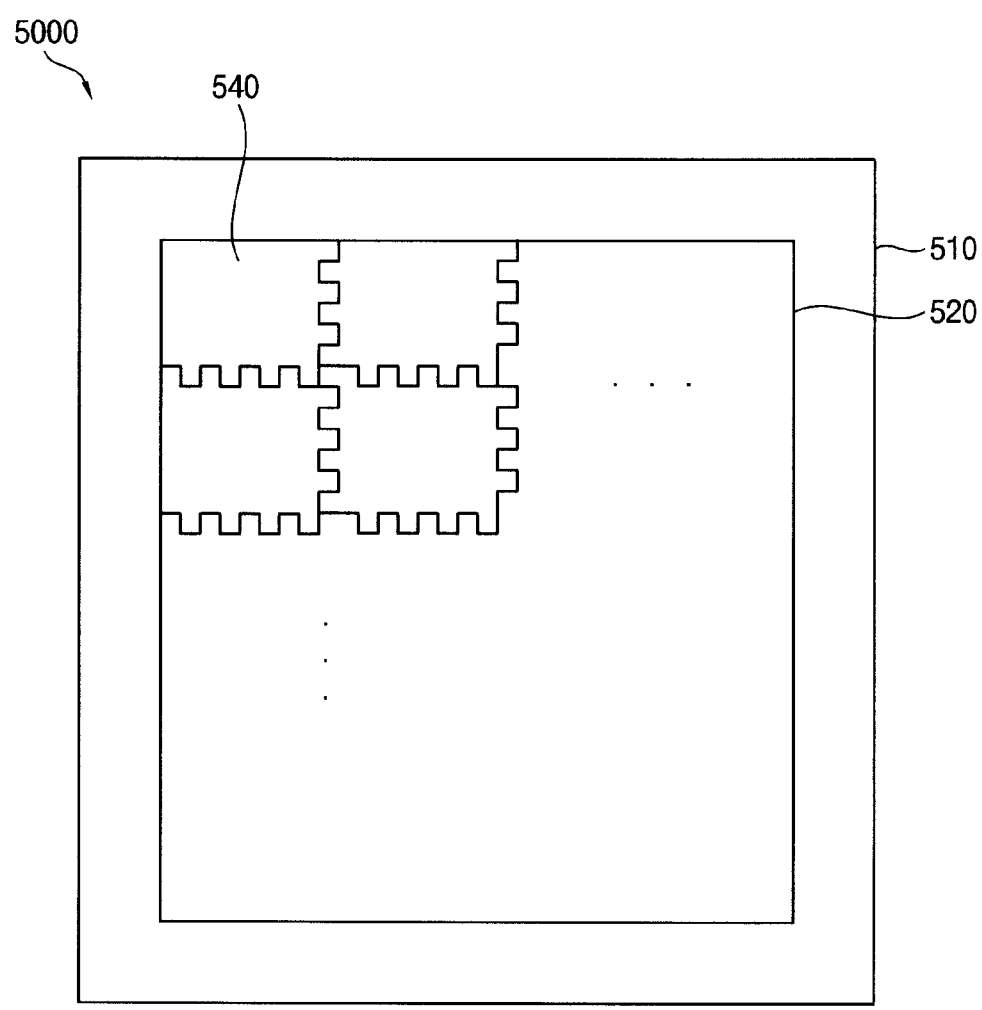
FIG. 12A is a plan view showing an array substrate crystallized using the mask of FIG. 1.

FIG. 12A is a plan view showing the array substrate 500. Referring to FIG. 12A, irradiation areas 540 having saw tooth-shaped edges are formed on the pixel area 520 of the array substrate 5000. The saw tooth-shaped edges are formed due to the offset of the lenses 30 in the peripheral area 12 of the mask 100, and due to the edges 121-124 of the mask 100 being sequentially disposed in the same positions.

Figure 12B:
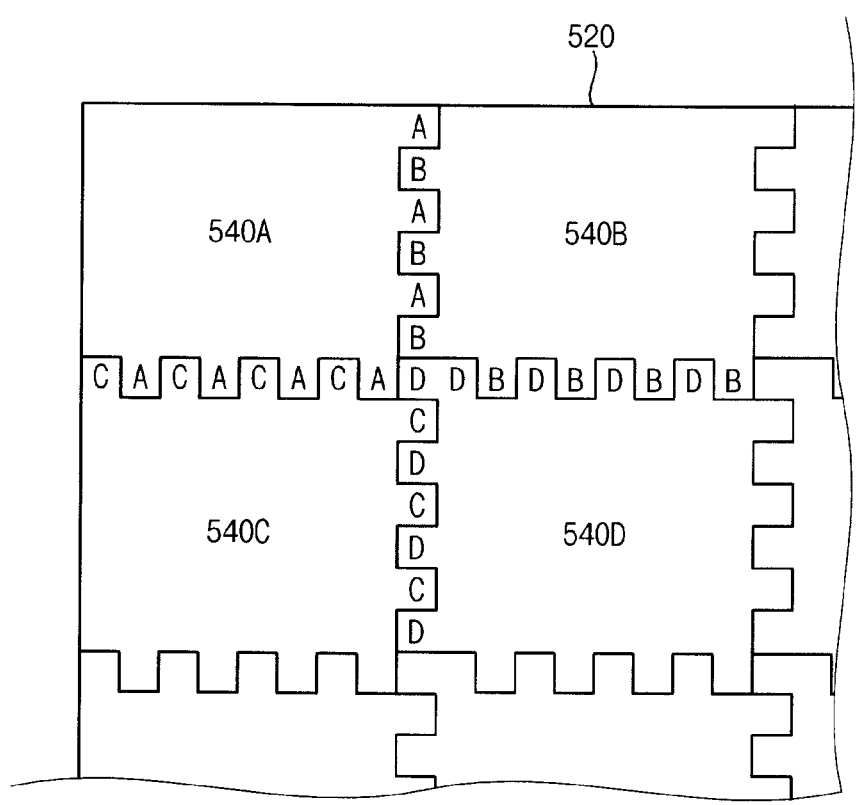
FIG. 12B is a partial enlarged plan view showing a portion of the array substrate of FIG. 12A.

FIG. 12B is a partial enlarged plan view showing a portion of an array substrate of FIG. 12A. Referring to FIG. 12B, the include array substrate 5000 includes four crystallization area 540A-540D. Boundary portions A, B, C and D of the crystallization area 540A-540D are interlaced. As such, if the intensity of a laser used to irradiate the crystallization areas 540A-

540D varies, such that the light produced by the crystallization areas 540A-540D varies in intensity, the interlacing of the boundary portions A, B, C and D obscures the changes in brightness. In other words, the visibility of brightness variations is reduced.

In the peripheral area 12 of the mask 100, one column or row of the lenses 30 is formed in each of the first to fourth sides 121-124. However, according to some aspects, the lenses 30 may arranged in multiple columns or rows in all or some of the first to fourth sides 121-124. In addition, the lenses 30 may be disposed randomly within the first to fourth sides 121-124, so long as opposing sides have corresponding lens patterns.

When the lenses 30 are arranged in the first to fourth sides 121, 122, 123, and 124 and the first to fourth corners 125, 126, 127, and 128 in a random pattern, the lens pattern of the first side 121 should be inverse to the lens pattern of the second side 122, and the lens pattern of the third side 123 should be inverse to the lens pattern of the fourth side 124.

Each of the first and second sides 121 and 122 is irradiated when disposed in area A, and each of the third and fourth sides 123 and 124 is irradiated when disposed in area B. Moreover, each of the first to fourth corners 125, 126, 127 and 128 is irradiated when disposed in area C.

Figure 13:
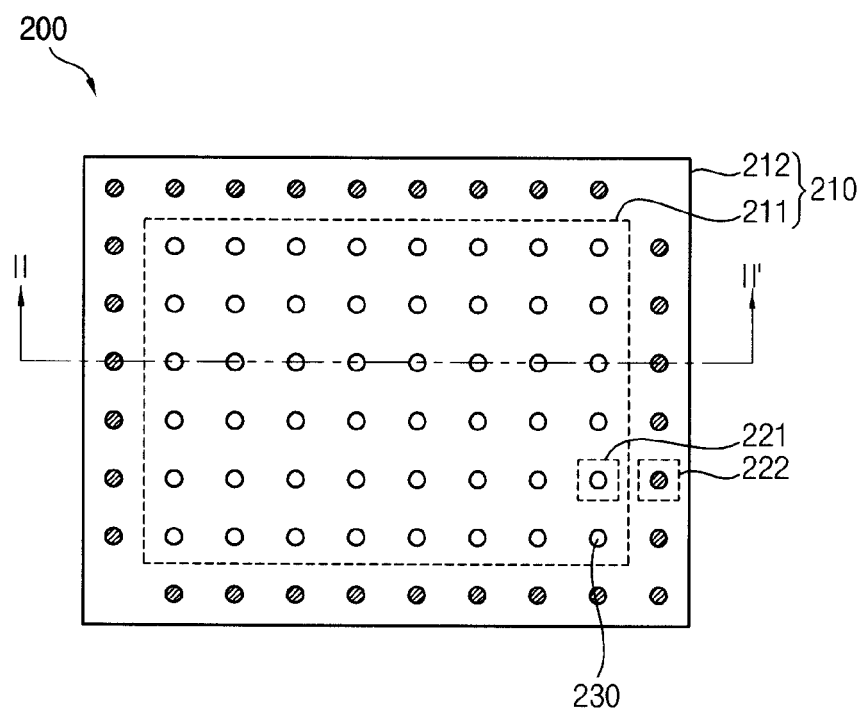
FIG. 13 is a plan view showing a mask, according to another exemplary embodiment of the present invention.
Figure 14:
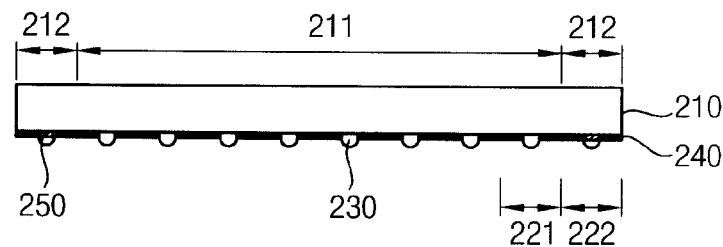
FIG. 14 is a cross-sectional view taken along a line II-IF of FIG. 13.

FIG. 13 is a plan view showing a mask 200, according to another exemplary embodiment of the present invention. FIG. 14 is a cross-sectional view taken along a line II-II' of FIG. 13. Referring to FIGS. 13 and 14, the mask 200 is similar to the mask 100, so only the differences therebetween will be described in detail.

The mask 200 includes a substrate 210, first areas 221 and second areas 222. The substrate 210 also includes a central area 211 and a peripheral area 212 disposed around the central area 211. Lenses 230 are disposed in a matrix of rows and columns in the central area 211, and lenses 231 are disposed the rows and columns in the peripheral area 212. A light blocking layer 240 is disposed on the substrate between the lenses 230 and 231.

A partial light-blocking layer 250 is disposed on the lenses 231. The partial light-blocking layer 250 may form a grating or grid. As such, the lenses 231 are partially covered, and may be referred to as half-tone lenses. For example, about half of the light transmitted to the lenses 231 passes therethrough. In other words, the partial light-blocking layer 250 may prevent about half of the light transmitted to the lenses 231 from being focused thereby.

Thus, active layers disposed below the lenses 231 receive about half of the light that is received by active layers disposed below the lenses 230 of the central area 211. As such, active layers disposed below the lenses 231 can be irradiated twice, before being completely crystallized. As a result, the lenses 231 are not offset on opposing sides of the central area 211.

The partial light-blocking layer 250 may be formed from a same material as the light-blocking layer 240. For example, the light blocking layer 240 may be formed on the lenses 231, and then partially removed by, for example, etching to form the partial light-blocking layer 250. As such, the partial light-blocking layer 250 may have a halftone pattern.

The substrate 210 and the lenses 230 and 231 may be integrally formed. The lenses 230 and 231 are formed on the substrate 210, and then the light-blocking layer 240 is formed therebetween.

Alternatively, the light-blocking layer 240 may be formed on another surface of the substrate 210, on which the lenses 230 and 231 are not formed. The partial light-blocking layer 250 may be formed on another surface of the substrate 210. Each of the light-blocking layer 240 and the partial light-blocking layer 250 may be formed on different surfaces of the substrate 210.

In the present exemplary embodiment, the light-blocking layer 240 and the partial light-blocking layer 250 are used to prevent unfocused light from passing through the substrate 210. Alternatively, the substrate 210 may be formed from an opaque material.

When the substrate 210 is opaque, the lenses 230 and 231 may be disposed on slits or holes formed in the substrate. When the substrate 210 is opaque, the light-blocking layer 240 may be omitted.

Figure 15:
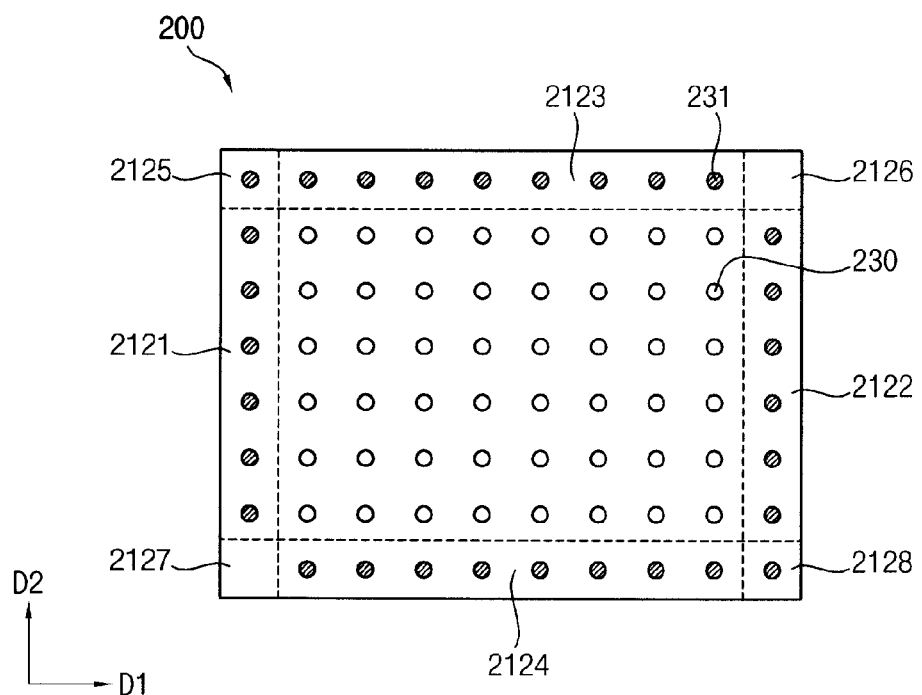
FIG. 15 is a plan view showing areas of the mask of FIG. 13.

FIG. 15 is a plan view showing the mask 200 of FIG. 13. Referring to FIG. 15, the peripheral area 212 includes a first side 2121, a second side 2122, a third side 2123, and a fourth side 2124. Moreover, the peripheral area 212 includes a first corner 2125, a second corner 2126, a third corner 2127, and a fourth corner 2128.

The first side 2121 and the second side 2122 are disposed on opposing sides of the central area 211 and extend lengthwise, in a first direction D1. The third side 2123 and the fourth side 2124 are disposed on opposing sides of the central area 211 and extend lengthwise, in a second direction D2. The second direction D2 may be substantially perpendicular to the first direction D1.

The first corner area 2125 is positioned between the first side 2121 and the third side 2123, and the second corner area 2126 is positioned between the third side 2123 and the second side 2122. The third corner area 2127 is positioned between the first side 2121 and the fourth side 2124, and the fourth corner area 2128 is positioned between the second side 2122 and the fourth side 2124.

The first and second sides 2121 and 2122 may be formed to have substantially the same shape, and the third and fourth sides 2123 and 2124 may be formed to have substantially the same shape. Lenses 231 are formed in the first and third corners 2125 and 2128. However, the lenses 231 may be formed in any two of the corners, as discussed below.

Figure 16:
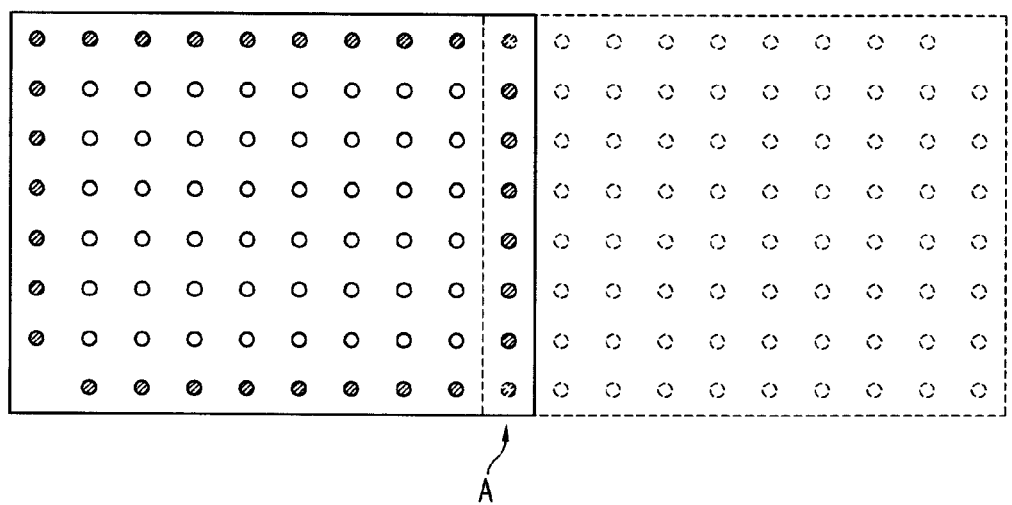
FIGS. 16 and 17 are plan views showing movements of the mask of FIG. 13.
Figure 17:
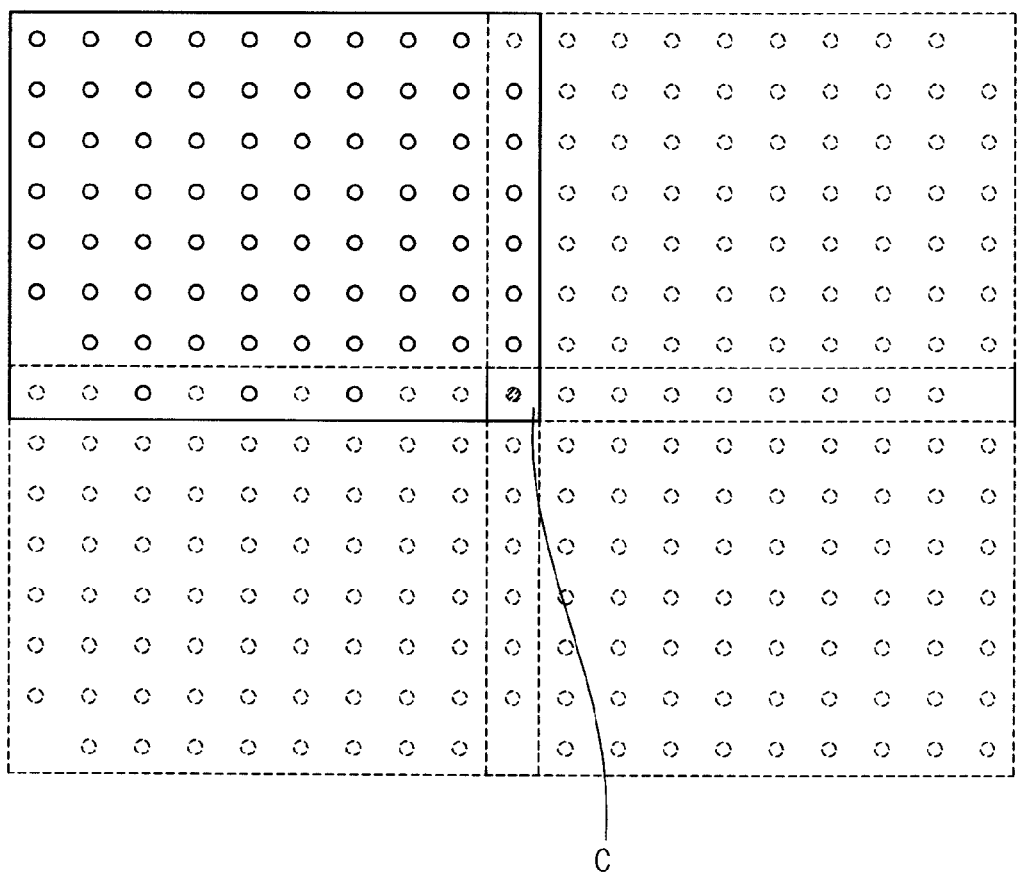
Figure 18A:
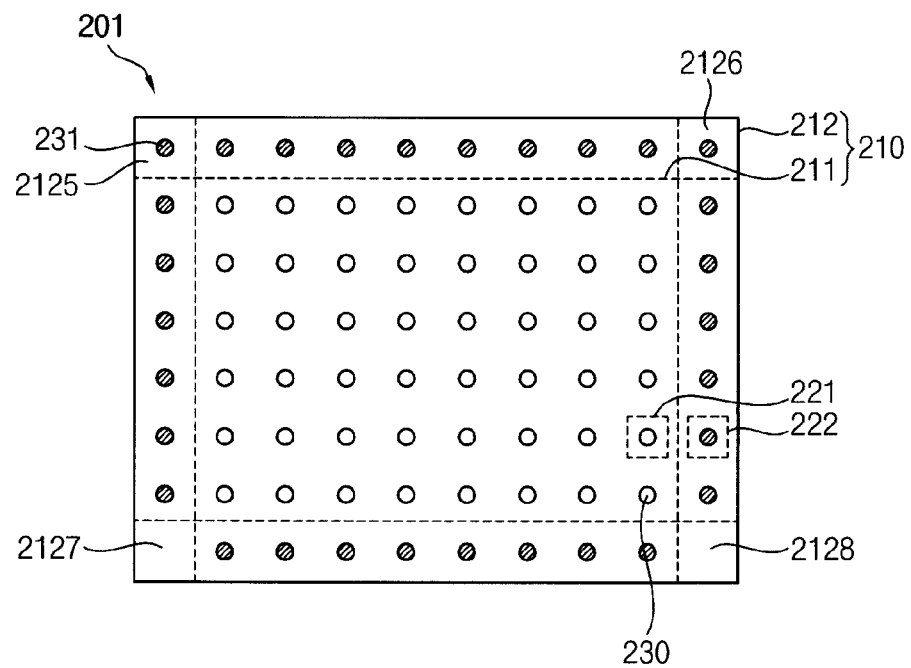
FIGS. 18A, 18B, 18C, and 18D are plan views showing modifications of the mask of FIG. 13.
Figure 18B:
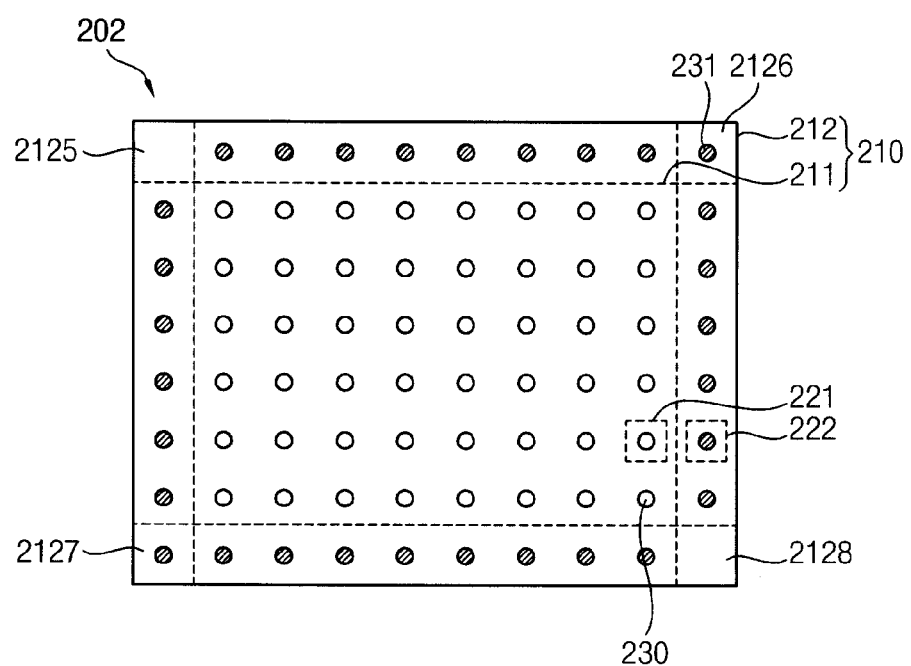
Figure 18C:
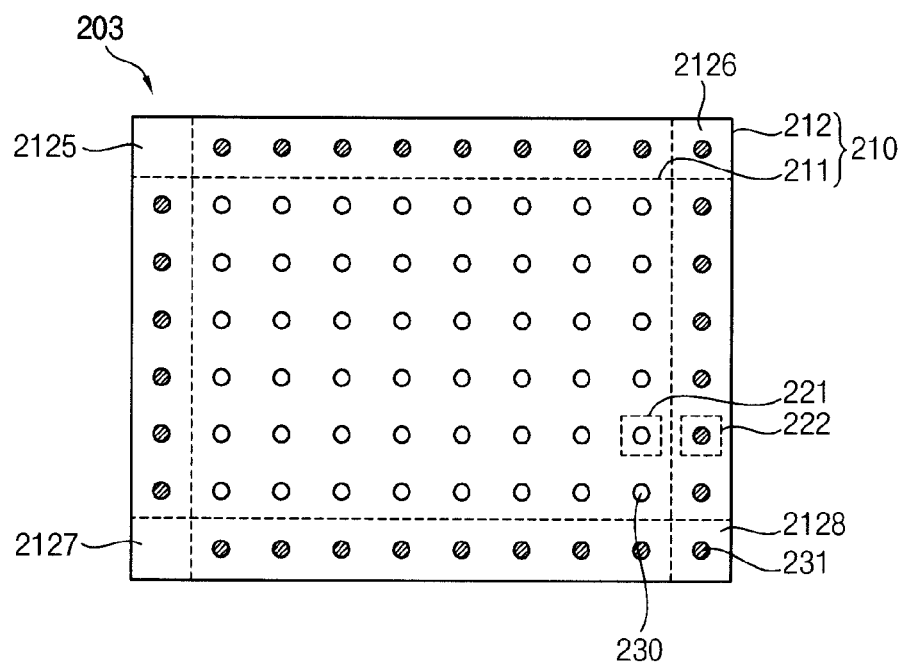
Figure 18D:
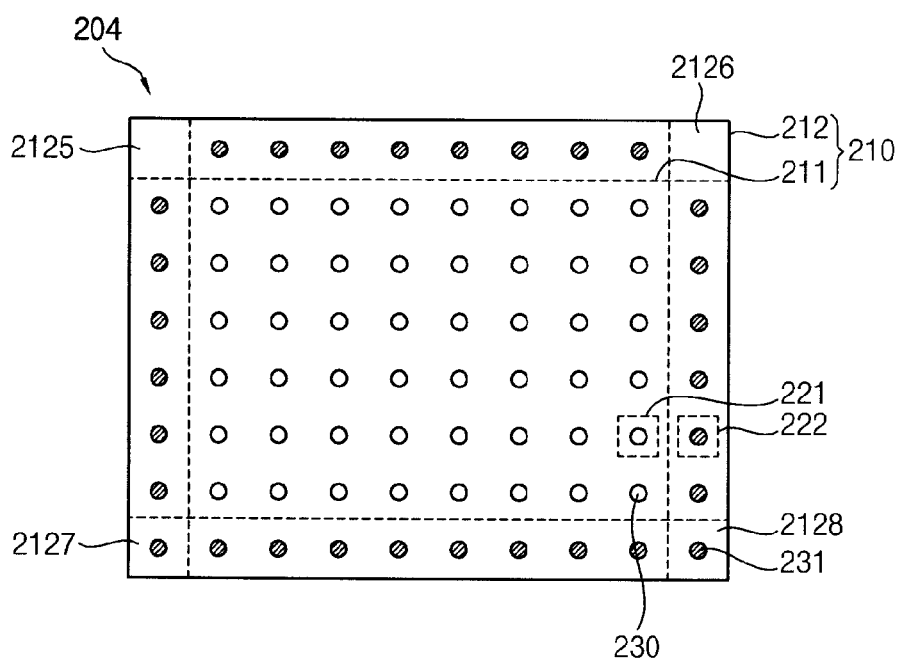

FIGS. 16 and 17 are plan views showing the horizontal and vertical movements of the mask 200, during irradiation of a substrate. The movements are substantially the same as shown in FIGS. 8 and 10, thus, only the difference therebetween will be discussed in detail.

Referring to FIG. 16, the lenses 231 of the first and second sides 2121 and 2122 are sequentially disposed in area A. Since these lenses are not offset 231, lenses 231 from each of the first and second sides 2121 and 2122 are sequentially disposed over the same silicon layers. Thus, each of the silicon layers in region A is irradiated twice. However, due to the partial light blocking layer 250, only half of the input laser light reaches the silicon layers during each irradiation, as compared to the silicon layers disposed below lenses 230.

Thus, when a laser is irradiated twice through the first side 2121 and the second side 2122, the corresponding silicon layers are crystallized. Similarly, when laser is irradiated twice through the third side 2123 and the fourth side 2124, the corresponding silicon layers are crystallized.

Referring to FIG. 17, the first to fourth corner areas 2125, 2126, 2127, and 2128 of the mask 200 are sequentially disposed in area C. Since only two of the corners include lenses 231, a silicon layer disposed in area C receives the same amount of laser light as silicon layers disposed under the lenses 230.

FIGS. 18A, 18B, 18C, and 18D are plan views showing masks 201, 202, 203 and 204, that are similar to the mask 200 of the mask of FIG. 13. As such, only the difference therebetween will be described in detail. Referring to FIGS. 18A to 18D, the mask 201 includes lenses 231 disposed in the first and second corners 2125 and 2126, the mask 202 includes lenses 231 disposed in the second and third corners 2126 and 2127, the mask 203 includes lenses 231 disposed in the second and fourth corners 2126 and 2128, and the mask 204 includes lenses 231 disposed in the third and fourth corners 2127 and 2128.

Since only two of the first to fourth corners 2125, 2126, 2127, and 2128 include lenses 231, even though all four corners 2125, 2126, 2127, and 2128 are irradiated over the same silicon layer, the silicon layer is uniformly crystallized. In other words, since two of the corners block the light, and the lenses 231 in the other two corners transmit only a portion of the input light, the total amount of light received by the corresponding silicon layer is the same as the amount received by the silicon layers disposed under the lenses 230.

Figure 19A:
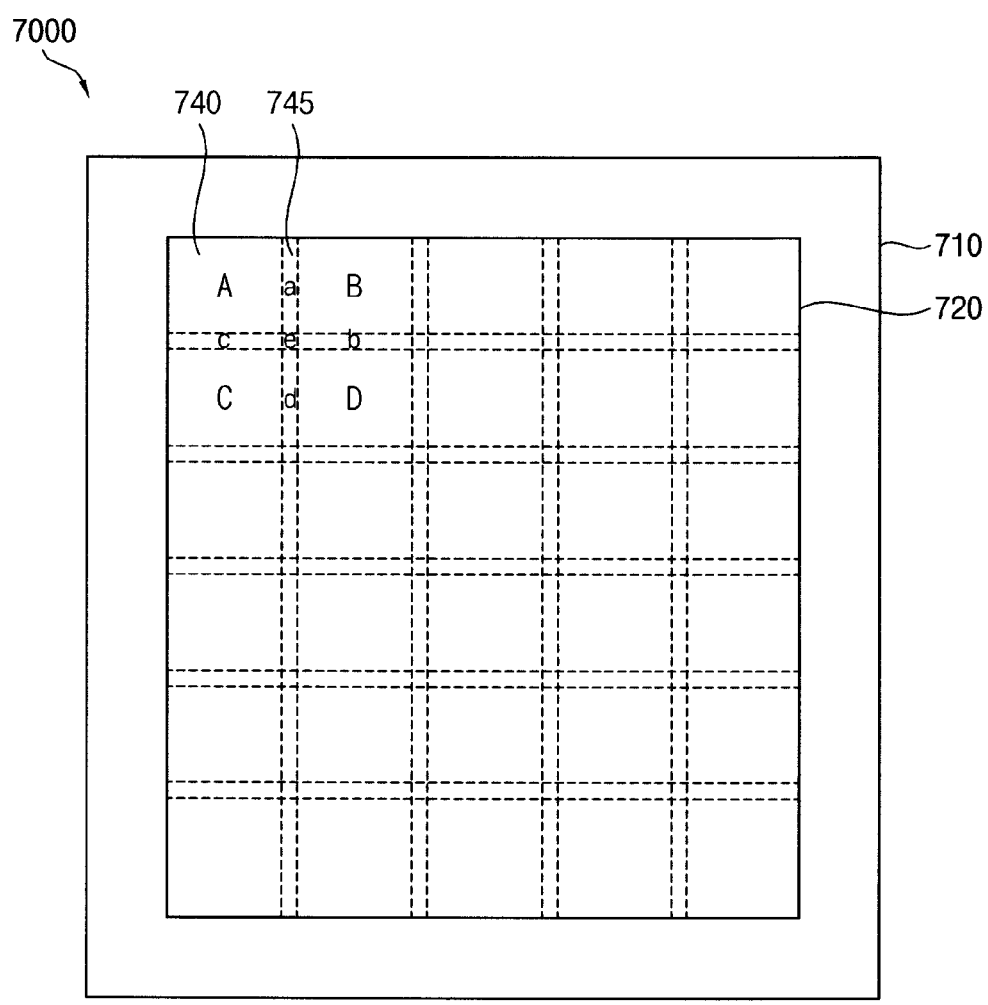
FIG. 19A is a plan view showing an array substrate that is crystallized using the mask of FIG. 13.
Figure 19B:
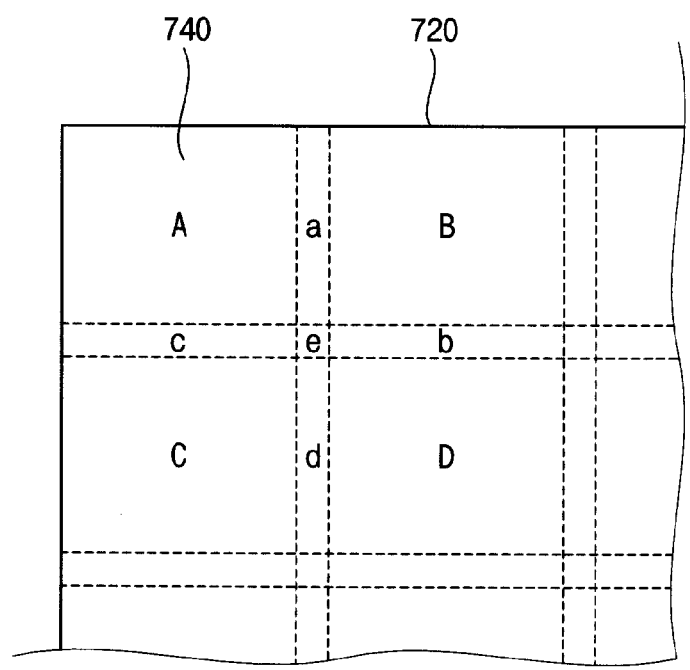
FIG. 19B is a partial enlarged plan view showing a portion of an array substrate of FIG. 20A.

FIG. 19A is a plan view showing an array substrate 7000 that has been crystallized using the mask of FIG. 13. FIG. 19B is an enlarge portion of the array substrate 7000 of FIG. 19A. Referring to FIGS. 19A and 19B, the array substrate 7000 includes a pixel area 720 and a peripheral area 710. The pixel area 710 is divided into crystallization areas 740 that are separated by boundary portions 745. The width of the boundary portions 745 is substantially equal to the width of the sides of the peripheral area 212. The crystallization areas 740 include crystallization areas A, B, C, and D. The boundary portions 745 include boundary areas a, b, c, d, and e, which are disposed between the crystallization areas A, B, C, and D.

When the peripheral area 212 of the mask 200 includes multiple rows and/or columns of lenses 231, the boundary areas 745 may be wider. When each of the crystallization areas 740 is irradiated with a laser, light intensity differences may produce brightness variations between the crystallization areas A, B, C, and D. Thus, when the pixel area 720 displays an image having a uniform brightness, the brightness variations may produce lines between the crystallization areas A, B, C, and D.

However, when laser intensity variations occur among crystallization areas A, B, C and D, the boundary areas a, b, c, d, and e include active layers formed by both intensities. Thus, appearance of brightness variation lines is reduced As described above, according to exemplary embodiments of the present invention, laser light is condensed through a lens formed on a mask to crystallize amorphous silicon, thereby increasing an electron mobility of a TFT formed on a pixel area, so that the TFT may be formed in a small size. Thus, a space of the TFT within one pixel may be decreased, so that an aperture ratio of the pixel may be greatly enhanced.

Moreover, in a process that one pixel area is divided into plural crystallization areas to be partially crystallized, a peripheral area of the mask is shared to be irradiated with laser having the different strength for crystallizing, so that a boundary between the crystallization areas may be reduced. Thus, a luminance difference on a screen may be reduced.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A mask comprising:
a substrate comprising a central area and a peripheral area disposed around the central area, the peripheral area comprising opposing first and second sides, and opposing third and fourth sides extending between the first and second sides; and
lenses disposed in rows and columns in the central area and in the first, second, third sides of the peripheral area; wherein,
the lenses of the first side of the peripheral area are disposed in different ones of the rows than the lenses of the second side of the peripheral area, and
the lenses of the third side of the peripheral area are disposed in different ones of the columns than the lenses of the fourth side of the peripheral area.

2. The mask of claim 1, further comprising a lens disposed in a corner of the peripheral area that is disposed between the first side and the third side.

3. The mask of claim 1, further comprising a light-blocking layer disposed on the substrate and between the lenses.

4. The mask of claim 3, when the lenses of the peripheral area are arranged in an irregular pattern.

5. The mask of claim 1, wherein in the peripheral area:
the lenses of the first side are disposed in one column;
the lenses of the second side are disposed in one column;
the lenses of the third side are disposed in one row; and
the lenses of the fourth side are disposed in one row.

6. The mask of claim 1, wherein in the peripheral area:
the lenses of the first side are disposed in at least two columns;
the lenses of the second side are disposed in at least two columns;
the lenses of the third side are disposed in at least two rows; and
the lenses of the fourth side are disposed in at least two rows.

7. A mask comprising:
a substrate comprising a central area and a peripheral area disposed around the central area;
first lenses disposed in rows and columns in the central area, to focus light onto a semiconductor layer; and
second lenses disposed in the peripheral area and in the rows and the columns, to focus light onto the semiconductor layer,
wherein for an equal amount of input light, the light focused by the second lenses has a lower intensity than the light focused by the first lenses.

8. The mask of claim 7, further comprising second lenses disposed in two corners of the peripheral area.

9. The mask of claim 8, wherein the second lenses are partially covered by a light-blocking layer.

10. The mask of claim 8, wherein the second lenses are half-tone lenses.

11. The mask of claim 7, further comprising a light-blocking layer disposed on the substrate between the first lenses and the second lenses,
wherein the light-blocking layer partially covers the second lenses.

12. The mask of claim 7, wherein the second lenses are disposed in two rows or two columns, on each side of the central area.

* * * * *